(12) United States Patent
Sakurai et al.

(10) Patent No.: US 7,749,920 B2
(45) Date of Patent: Jul. 6, 2010

(54) LOW DIELECTRIC CONSTANT FILMS AND MANUFACTURING METHOD THEREOF, AS WELL AS ELECTRONIC PARTS USING THE SAME

(75) Inventors: Toshio Sakurai, Fukuyama (JP); Takayuki Takahagi, Higashi-Hiroshima (JP); Hiroyuki Sakaue, Higashi-Hiroshima (JP); Shoso Shingubara, Higashi-Hiroshima (JP); Hiroyuki Tomimoto, Tsukuba (JP)

(73) Assignee: Rorze Corporation, Hiroshima (JP)

( * ) Notice: Subject to any disclaimer, the term of this patent is extended or adjusted under 35 U.S.C. 154(b) by 939 days.

(21) Appl. No.: 10/564,393

(22) PCT Filed: Jun. 25, 2004

(86) PCT No.: PCT/JP2004/009009
§ 371 (c)(1),
(2), (4) Date: May 8, 2006

(87) PCT Pub. No.: WO2005/008762
PCT Pub. Date: Jan. 27, 2005

(65) Prior Publication Data
US 2006/0244034 A1    Nov. 2, 2006

(30) Foreign Application Priority Data

| Jul. 17, 2003 | (JP) | ............................. 2003-276147 |
| Aug. 28, 2003 | (JP) | ............................. 2003-304153 |
| Mar. 15, 2004 | (JP) | ............................. 2004-073600 |

(51) Int. Cl.
*H01L 21/31* (2006.01)
(52) U.S. Cl. ............... 438/778; 438/758; 257/E21.576
(58) Field of Classification Search ............... 438/758, 438/778, 783, 780
See application file for complete search history.

(56) References Cited

U.S. PATENT DOCUMENTS 5,332,697 A    7/1994    Smith et al.

(Continued)

FOREIGN PATENT DOCUMENTS

JP    A 61-6198    1/1986

(Continued)

OTHER PUBLICATIONS

Hiroyuki Tomimoto et al., "The 50$^{th}$ Spring Meeting", The Japanese Society of Applied Physics and Related Societies Extended Abstracts, No. 2, 29a-ZG-1, p. 913, 2003 (with English translation).

(Continued)

*Primary Examiner*—Walter L Lindsay, Jr.
*Assistant Examiner*—Reema Patel
(74) *Attorney, Agent, or Firm*—Oliff & Berridge, PLC

(57) ABSTRACT

While a fine porous diamond particle film has been known as a high heat resistant and low dielectric constant film and also has high mechanical strength and heat conductivity, and is expected as an insulating film for multi-layered wirings in semiconductor integrated circuit devices, it is insufficient in current-voltage characteristic and has not yet been put into practical use. According to the invention, by treating the fine porous diamond particle film with an aqueous solution of a salt of a metal such as barium and calcium, the carbonate or sulfate of which is insoluble or less soluble, and a hydrophobic agent such as hexamethyl disilazane or triethyl monochloro silane, as well as a reinforcing agent containing one of dichlorotetramethyl disiloxane or dimethoxytetramethyl disiloxane, thereby capable of putting the dielectric breakdown voltage and the leak current within a specified range of a practical standard.

9 Claims, 4 Drawing Sheets

U.S. PATENT DOCUMENTS

2006/0040110 A1 * 2/2006 Kohmura et al. ............ 428/446

FOREIGN PATENT DOCUMENTS

| JP | A 6-97671 | 4/1994 |
| JP | A 7-320538 | 12/1995 |
| JP | A 9-263488 | 10/1997 |
| JP | A 2002-110870 | 4/2002 |
| JP | A 2002-289604 | 10/2002 |
| JP | A-2005-263575 | 9/2005 |
| WO | WO2004/026765 A1 * | 4/2004 |

OTHER PUBLICATIONS

Hiroyuki Tomimoto et al., "The 51$^{st}$ Spring Meeting", The Japanese Society of Applied Physics and Related Societies Extended Abstracts, No. 2, 28p-P3-19, p. 920, 2004 (with English translation).

Sachiko Ishikawa et al., "The 51$^{st}$ Spring Meeting", The Japanese Society of Applied Physics and Related Societies Extended Abstract, No. 1 28p-F-2, p. 206, 2004 (with English translation).

Hiroyuki Tominoto et al., "The 64$^{th}$ Autumn Meeting", The Japanese Society of Applied Physics and Related Societies Extended Abstracts, No. 2, 1a-YB-3, p. 753, 2003 (with English translation).

* cited by examiner

LOW DIELECTRIC CONSTANT FILMS AND MANUFACTURING METHOD THEREOF, AS WELL AS ELECTRONIC PARTS USING THE SAME

TECHNICAL FIELD

The present invention concerns a low dielectric constant thin film as an insulating film of a porous structure in which fine diamond particles are bonded, and a manufacturing method thereof, as well as an electronic part such as a semiconductor integrated circuit device of high integration degree and high speed operation type using the same.

BACKGROUND ART

Among semiconductor integrated circuit devices, particularly in super LSI devices, delay of signals passing through wirings prepared in devices gives rise to a significant problem along with lowering of power consumption as the wirings become finer and are more integrated. Particularly, in a high speed logic device, RC delay due to the resistance and the distribution capacity of wirings results in most prominent subject and, among all it is necessary to use a material of low dielectric constant for inter-wiring insulating materials in order to decrease the distribution capacity.

Heretofore, as an insulating film in a semiconductor integrated circuit, a silica film ($SiO_2$), a tantalum oxide film ($Ta_2O_5$), an aluminum oxide film ($Al_2O_3$), a nitride film ($Si_3N_4$) and the like have been used and, particularly, as an insulating material between multilayer willing, a nitride film and a silica film doped with an organic material or fluorine have been used or studied as the low dielectric constant film. Further, as an insulating film for further lowering the dielectric constant, a fluororesin, a silica film formed by baking a foaming organic silica film, a porous silica film formed by depositing fine silica particles, etc. have been studied.

On the other hand, since diamond is more excellent in the heat conductivity and the mechanical strength than other materials, this is a material suitable to heat dissipation for semiconductor devices of high integration degree and large heat generation amount and has been studied in recent years. For example, JP-A No. 6-97671 proposes a diamond film of 5 μm thickness by a film forming method such as a sputtering method, ion plating method or duster ion beam method. Further, JP-A No. 9-263488 proposes a film forming method of scattering fine diamond particles on a substrate and growing diamond crystals using them as nuclei by supplying carbon by a CVD (Chemical Vapor Deposition) method.

The present inventors have obtained a specific dielectric constant of 2.72 by a fine diamond particle film of a porous structure as already disclosed in JP-A No. 2002-110870. Further, since fine diamond particles do not bond to each other, this results in a problem that the film strength is lowered and, in order to solve the problem, JP-A No. 2002-289604 proposes a reinforcing method by crosslinking fine diamond particles by means of a hexachlorodisiloxane treatment and it is shown that a specific dielectric constant comparable with that in JP-A No. 2002-110870 is obtained also by the treatment.

Further, the present inventors have reported that a specific dielectric constant of 2.1 is obtained by heating and purifying fine diamond particles in a mixed acid comprising sulfuric acid/nitric acid in the Academic Conference (The 50th meeting of the Japan Society of Applied Physics and Related Societies, Pre-text No. 2, p 913 (2003)).

Materials known so far as having low dielectric constant are listed in the following table.

TABLE 1

| Name of material | Specific dielectric constant |
|---|---|
| Silica (plasma CVD) | 4.2-5.0 |
| Fluorine-added silica | 3.7 |
| Diamond (single crystal) | 5.68 |
| Porous silica | 1.5-2.5 |
| Porous diamond | 2.1-2.72 |
| Polyimide | 3.0-3.5 |
| Polytetrafluoroethylene | 1.9 |
| Gas | 1 |

Patent Document 1: JP-A No. 6-97671

Patent Document 2: JP-A No. 9-263488

Patent Document 3: JP-A No. 2002-110870

Patent Document 4: JP-A No. 2002-289604

Non-Patent Document 1: The 50th meeting of the Japan Society of Applied Physics and Related Societies, Pre-text No. 2, p 913 (2003).

DISCLOSURE OF THE INVENTION

As described above, for further improvement of the integration degree, various studies have been made for obtaining materials having a specific dielectric constant being lower than 3.7 of the fluorine-added silica in the table. Since the silica film per se comprises two kinds of atoms of oxygen and silicon of high electronegativity, orientation polarization remains and it is insufficient as the low dielectric constant film, so that porous silica produced by a blowing method of fine particles has been studied. However, they are insufficient in the mechanical strength and have not yet been put to practical use. Further, while polytetrafluoroethylene as the fluororesin shown in the table has a sufficient specific dielectric constant, this can not be used since a severe condition for the required heat resistance from 300° C. to 400° C. or higher in the semiconductor manufacturing process can not be satisfied While the polyimide is a heat resistant resin, it is carbonized at 400° C. or higher and can not be used as well.

As a result of further study, it has been found that the dielectric breakdown voltage and insulation resistance are insufficient. This is because fine diamond particles contain amorphous carbon and graphite as impurities as disclosed in JP-A No. 9-263488. Accordingly, while fine diamond particles as coarse raw material are oxidized by a concentrated sulfuric acid or concentrated nitric acid to remove the impurities, this is not yet sufficient and, while various methods such as increase of the oxidation temperature in the acid treatment has been studied, a sufficiently high electric resistance value and a sufficiently high dielectric breakdown voltage have not yet been attained.

In the course of such studies, the present inventors have found that when fine diamond particles are treated with nitric acid, hydroxy groups, the carboxyl groups are formed on the surface and when they are further treated with sulfuric acid, sulfonic acid groups are further formed in addition to them. That is, it is considered that leak current is caused and the dielectric breakdown voltage is not increased as well by the water molecules having affinity with the hydrophilic groups and impurities contained in a trace amount.

In addition, it has been found in a further study that electric characteristics were insufficient in which the dielectric breakdown voltage was 0.58 MV/cm while it should be 1.0 MV/cm or higher and the leak current value as the reciprocal of the insulation resistance was $10^{-4}$ A/cm$^2$ at 0.58 MV/cm while it should be $10^{-6}$ A/cm$^2$ or less as shown by the symbol "□" in FIG. 3

As a result of seeking for the cause by using infrared absorption spectroscopy, it was found that when purified fine diamond particles are treated with hexachlorodisiloxane, a broad absorption spectrum for hydroxy group increased at the wave number of 3400 cm$^{-1}$. It is considered that the hydroxy groups form HO—Si bonds due to the hydrolysis of unreacted Cl—Si bond of hexachlorodisiloxane with water content in air. In the course of the study described above, the present inventors have found that the leak current was caused and the dielectric breakdown voltage is not increased by the water molecules having affinity with the hydroxy groups and impurities contained in a trace amount.

Means for Solving the Problems

With an aim of suppressing generation of the hydrogen ions, the present inventors have made an earnest study and, as a result, have developed an excellent low dielectric constant film having at least fine diamond particles and pores, in which the low dielectric constant film contains metals of at least one of substance selected from the group consisting of various metal carbonate substances and various metal sulfate substances having a solubility to water at an ambient temperature of 1 g/100 g or less, and have accomplished the present invention.

While most of metals except for some metals have electrical conductivity in the form of an element or metal ion dissolved in water, the metal oxides and water insoluble metal salts thereof are insulators. In the invention, the dielectric breakdown voltage and the insulation resistance can be improved by rendering carboxyl groups and sulfonic groups as ionic groups on the surface of fine diamond particles nonionic, that is, non-water soluble or less water soluble. As a result of study on the relation between the solubility to water and the dielectric breakdown voltage and insulation resistance of the metal carbonate salt or the metal sulfate salt as the standard for the less solubilization, it has been found an effect of improving them when it is at least 1 g/100 g or less at an ambient temperature. It is preferred that the water solubility of the metal carbonate or the metal sulfate is lower and, further, it is more preferably 0.01 g/100 g or less, and they may be also those known as insoluble.

The metal contained in the low dielectric constant film of the invention is particularly preferably at least one member of the group consisting of calcium, strontium, barium, mercury, silver, lead and radium. Any of the carbonates of the metals has a solubility to water at an ambient temperature of as low as $10^{-3}$ to $10^{-4}$ g/100 g and any of the sulfate salts thereof has a solubility to water at an ambient temperature of as low as from 0.6 to $10^{-6}$ g/100 g, which are suitable to the object of the invention. Among the metals, calcium, barium, strontium and silver are most preferred.

As a method of containing the metals into the low dielectric constant film, after forming a fine diamond particle film having pores by a known method, a water soluble salt of a metal such as hydroxide, hydrochloride and nitrate with the solubility to water of the metal carbonate or the metal sulfate of 0.1 g/100 g or less is selected and dissolved in water, the solution is impregnated into the pores of the fine diamond particle film and bonded with the carboxyl groups or/and sulfonic acid groups bonded to the surface of fine diamond particles thereby rendering them insoluble, followed by water washing and drying. Thus, a low dielectric constant film subjected to the metal salt insolubilizing treatment of the invention can be obtained.

The treating solution used in the invention includes, for example, an aqueous solution of calcium hydroxide, calcium chloride, calcium nitrate, strontium chloride, strontium nitrate, barium hydroxide, barium chloride, barium nitrate, mercury nitrate, silver nitrate, lead nitrate, and radium chloride. The concentration of the treating solution is preferably between 0.1% by weight and 20% by weight. In a case where the concentration is less than 0.1% by weight, the treating rate is slow, which is not preferred. In a case of the concentration of an aqueous solution exceeding 20% by weight or a saturated concentration, it becomes difficult to sufficiently wash excess salts intruded in the pores with water, which is not preferred.

A fine diamond particle film having pores is prepared by coating and drying an aqueous dispersion thereof to a single crystal silicon substrate drawn with a circuit or a glass substrate drawn with a circuit or a conductive film. The fine diamond particle film may be directly treated with a treating solution of the invention described above or may be treated after reinforcing the fine diamond particle film with hexachlorodisiloxane, etc. The treating method includes, for example, a method of dipping a fine diamond particle film coated on a substrate in the treating solution, a method of coating the treating solution at a high concentration of the invention on the film, or a method of particulating and spraying the treating solution of the invention on the film.

The invention also includes an electronic part having the low dielectric constant film described above as a constituent element. As the electronic part, a semiconductor integrated circuit of high integration degree and high speed operation type is most suitable but it may also be a usual semiconductor device or micro machine, or a usual capacitor having a low dielectric constant film containing the above-described metal and fine diamond particles and comprising pores (porous fine diamond particle film).

The fine diamond particles used in the invention are preferably solid particles with a particle size of from 1 nm to 1000 nm and purified to a purity of 95% or higher. Further, the porosity of the low dielectric constant film of the invention is preferably from 40% to 70%.

Since the fine diamond particle film of the invention has pores, the surface is naturally rough and it is can be densified. For this purpose, a known method such as an SOG (Spin on Glass) method, an SG (Silicate Glass) film method, a BPSG (Boron Phosphate SG) film method or a plasma CVD method can be used.

Further, the present inventors have made an earnest study with an aim of increasing the electric resistance value, that is, lowering the leak current and, as a result, have developed a low dielectric constant film having at least fine diamond particles and pores, in which the surface of fine diamond particles have a group of the general formula —X which is more hydrophobic than —OH (hydroxyl) group and have accomplished the invention.

X of the general formula —X group is preferably hydrogen, fluorine, $C_1$ to $C_4$ alkoxy group, phenoxy group, o-(n- or p-)alkylphenoxy group (in which the alkyl group: $C_1$ to $C_4$), OCOR, OCONRR' or OSiR$_3$ [R and R' each represents hydrogen, $C_1$ to $C_4$ alkyl group, phenyl group, o-(m- or p-)alkylphenyl group].

A more preferred group in the general formula —X group in view of heat resistance represents fluorine or OSiR$_3$ [where R, R' each represents hydrogen, $C_1$ to $C_4$ alkyl group, phenyl group, O-(n- or p-)alkylphenyl group], which can withstand a heat treatment condition at 300° C.

In the method of manufacturing the low dielectric constant film of the invention, fine diamond particles are at first suspended in a solvent such as water and coated and dried by a known method on a substrate to form a film and a hydrophobic agent is reacted in a gas state or a liquid state with active hydroxyl groups on the surface of the fine diamond particles. As the reaction conditions in this case, temperature, concentration and time optimal to the reactivity with respective hydrophobic agent and hydroxyl group are set.

The hydrophobic agent for forming $OSiR_3$ group as X in the general formula —X group includes, for example, alkyl halogen silane such as trimethyl monochlorosilane and dimethyl dichlorosilane, di(tetra, hexa or hepta) alkyl disilazane such as hexamethyl disilazane and heptamethyl disilazane, dialkylaminotrialkyl silane such as dialkylaminotrimethyl silane, trialkylmonoalkoxy silane such as trimethylmonomethoxy silane, N,O-bis(trialkyl silyl)acetoamide such as N,O-bis(trimethylsilyl)acetoamide, N,O-bis(trialkylsilyl) trihalogen acetoamide such as N,O-bis(trimethylsilyl)trifluoro acetoamide, alkylsilyl imidazole such as trimethylsilyl imidazole and butyldimethylsilyl imidazole, arylated alkyl monohalogen silane such as triphenyl monochloro silane, monophenyl monochloro dimethyl silane and diphenyl monochloro monomethyl silane, and arylated monoalkoxy alkyl silane such as triphenyl monomethoxy silane, monophenyl dimethyl methoxy silane, and diphenyl monomethoxy monomethyl silane.

Further, the hydrophobic agent forming the alkoxy group as the X group includes diazoalkylene such as diazomethane or diazoethane. The hydrophobic agent forming the OCOR group as the X group includes acetyl chloride, propionic acid chloride, or butyric add chloride. The hydrophobic agent forming the OCONHR group as the X group includes alkyl isocyanate such as methyl isocyanate, ethyl isocyanate, propyl isocyanate, or butyl isocyanate. Further, in a case where X is hydrogen, hydrogen gas, silane, disilane or lithium aluminum hydride can be used and in a case where X is fluorine, fluorine gas, xenone fluoride, tetrafluoro silicon, and fluoro alkane such as mono(di, tri or tetra)fluoromethane can be used.

The fine diamond particle film having pores are prepared by coating and drying the aqueous dispersion thereof on a single crystal silicon substrate drawn with a circuit or a glass substrate drawn with a circuit or a conductive film. The fine diamond particle film may be treated directly with the hydrophobic agent according to the invention described above, or the fine diamond particle film may be strengthened by interparticle crosslinking using hexachlorodisiloxane, 1,3-dichlorotetramethyl disiloxane or dichlorodimethyl silane, followed by hydrophobic treatment. The hydrophobic treating method includes, for example, a method of dipping the fine diamond particle film coated on a substrate in a solution of a hydrophobic agent, a method of coating the solution of a hydrophobic agent on the film, a method of particulating and spraying a treating solution of the invention on the film, a method of vaporizing a hydrophobic agent under heating or at an ambient temperature and reacting the same alone or being diluted with a solvent, or a method of reacting in a plasma atmosphere in a case of a gaseous substance such as hydrogen or fluorine.

Sulfoxyl groups or carboxyl groups may sometimes be present on the surface of the fine diamond particles used in the invention as described above. In this case, at least one member of the group consisting of calcium, strontium, barium, mercury, silver, lead and radium may also be bonded to the groups. The method of containing the metals into the low dielectric constant film may be a known method. That is, it includes a method of forming a fine diamond particle film having pores, then selecting a water soluble salt such as the hydroxide, hydrogen chloride or nitride of the metal and dissolving the same in water, impregnating the solution into the pores of the fine diamond particle film, bonding the metal with the carboxyl groups and/or sulfonic acid groups bonded to the surface of the fine diamond particles to insolubilize the metal and then water washing and drying the same, or a method of adding the diluted metal salt solution to a dispersion liquid of fine diamond particles. In a case of conducting the metal salt treatment and the hydrophobic agent treatment together, while any one of them may be conducted previously, a method of conducting the former previously is easy for the treatment. Combination of the metal salt treatment and the hydrophobic agent treatment together provides the effects of both of them, thereby further improving the insulation resistance and the dielectric breakdown voltage.

The invention also includes an electronic part having the low dielectric constant film described above as a constituent element. As the electronic part, a semiconductor integrated circuit of high integration degree and high speed operation type is most suitable, but it may also be a usual semiconductor device or micro machine, or a usual capacitor having the low dielectric constant film containing the metal and fine diamond particles and comprising pores (fine porous diamond particle film).

The fine diamond particles used in the invention are preferably solid particles with a particle size of from 1 nm to 1000 nm and purified to a purity of 95% or higher. Further, the porosity of the low dielectric constant film of the invention is preferably from 40% to 80%. In a case where it is 40% or less, the dielectric constant increases to 3 or more mainly in a case where the distribution of the particle size of the fine diamond particles is broad, which is not preferred. Further, in a case where it is 80% or more, a sufficient mechanical strength cannot be obtained, which is insufficient for practical use.

Since the fine diamond particle film of the invention has pores, the surface is naturally rough and, accordingly, it is preferably densified. For this purpose, a known method such as an SOG (Spin on Glass) method, an SG (Silicate Glass) film method, a BPSG (Boron Phosphate SG) film method or a plasma CVD method, or a method of coating a dispersion liquid of fine diamond particles of 5 nm or less, etc. can be used.

The present inventors have made an earnest study on the reinforcing agent for the fine diamond particle film with an aim of improving the electric characteristics and, as a result, have developed a low dielectric constant film having at least fine diamond particles and pores, characterized by a reinforcing treatment of crosslinking fine diamond particles to each other, by treating the surface of the fine diamond particles with at least one member of the substances at least represented by the following general formula (a), thereby obtaining a remarkable improvement.

(a) General formula: $X_nR_{3-n}Si(OSiR_2)_mOSiR_{3-n}X_n$ (in which n=1 or 2, m=an integer of 0 to 2, X represents halogen group, $C_1$ to $C_6$ alkoxy group or phenoxy group, and R represents $C_1$ to $C_6$ alkyl group).

Further, a low dielectric constant film having a sufficient strength and satisfactory electric characteristics could be obtained by treating the surface of the fine diamond particles not only with the substance represented by the above general formula (a) alone, but also with mixed substances of at least one of the substances represented by the following general formula (b) and the substance represented by (a) described above.

(b) General Formula: $X_3Si(OSiR_2)_mOSiX_3$ (where m=integer of 0 to 3, X represents halogen group, $C_1$ to $C_6$ alkoxy group or phenoxy group).

The method of treating the fine diamond particle film includes, for example, a method of dipping in a liquid containing at least the compound of the general formula (a) and/or (b) (hereinafter referred to as a reinforcing agent), a method of coating a liquid containing the reinforcing agent on the film, a method of spraying a liquid containing the substance used in the invention on the film, or a method of treatment by exposing the film to the reinforcing agent as alone or being diluted with a solvent as vapor under heating or at an ambient temperature.

In a case of mixing the compound of the general formula (a) and the compound of the general formula (b), while (a) and (b) may be from 2:98 to 98:2 by weight ratio, it is more preferred that they are at 70:30 to 10:90. The weight ratio is based on a mixed weight ratio in a liquid state before treating the surface of the fine diamond particles. In a case of treatment in a gas state, it is necessary to take the vapor pressure of each substance at a treating temperature into consideration. Hexachlorodisiloxane has higher reactivity than hexamethoxydisiloxane to the hydroxy group. However, the former releases hydrogen chloride and the latter releases methanol as a by-product. In a case of forming the low dielectric constant film of the invention in the course of manufacturing a semiconductor circuit, since chlorine ions may sometimes give undesired effects, the latter is preferred as the treating agent. However, in a circumstance where chlorine ions are removed sufficiently, the former is used. Accordingly, in a case of using the former and the latter in admixture, the mixing ratio can be determined optionally in accordance with the situation of the processes for manufacturing various semiconductor circuits.

In the above general formula (a) and/or (b), X is at least one halogen group selected from the group consisting of fluorine, chlorine, bromine, and iodine, or alkoxy group having $C_1$ to $C_6$ alkyl or phenoxy group, R is $C_1$ to $C_6$ alkyl group. In a case where C is more than 6 both for the alkoxy group and the alkyl group, the reaction rate with the hydroxy group is lowered, which is not preferred. Further, the phenoxy group ($C_6$) has reactivity and can be used in the invention. The criterion for selecting either the halogen group or the alkoxy group as X can be determined in view of the above-described reactivity and the chlorine ion removing circumstance.

Then, in the above general formula (a) and/or (b), in a case where m exceeds 3, the siloxane chain is lengthened to increase the viscosity, thereby making it difficult for impregnation between fine diamond particles in a case of treatment in the liquid state, which is not preferred. Further, also in a case of treatment with vapors of the siloxane compound, the boiling point is increased when m exceeds 3, which is not preferred. Accordingly, a case where m is 0, that is, a disiloxane compound is most preferred.

In the above general formula (a) and/or (b), it is most preferred that X is at least one member selected from the group consisting of reactive chlorine group, methoxy group or ethoxy group and R is a hydrophobic methyl group or ethyl group. In addition, it is preferred that m is 0, i.e. a disiloxane compound and further that n is 1 or 2, i.e., two or four chlorine groups or alkoxy groups such as methoxy groups or ethoxy groups or four or two methyl groups or ethyl groups.

The fine diamond particle film having pores of the invention is formed on a semiconductor substrate such as a single crystal or polycrystal silicon substrate, a compound semiconductor substrate, a quartz substrate, a ceramic substrate, and a glass substrate, or on a intermediate product substrate for manufacturing semiconductor formed with various circuits. A colloidal solution of the fine diamond particle is coated on the surface of the substrate after the hydrophilic treatment by oxidation.

In addition to the treatment for the film per se deposited by coating the colloidal solution of the fine diamond particles as described above with the compound of the above general formula (a) and/or (b) of the invention, it may be sometimes necessary to improve the adhesion between the substrate and the film. In this case, the adhesion between the substrate and the fine diamond particle film can be improved also by applying a pretreatment with the compound of the above general formula (a) and/or (b), among all one or mixture of hexachlorodisiloxane and hexamethoxydisiloxane between the hydrophilic treatment and the coating. In this case, treatment such as drying and heating may optionally be applied for sufficient reaction.

In the invention, in a case where X is $C_1$ to $C_6$ alkoxy group or phenoxy group in the general formula (b): $X_3Si(OSi)mX_3$, it may be used as a treating agent without mixing with the substance (a). This substance can react with hydroxy groups on the surface of fine diamond particles at a room temperature or by heating to conduct crosslinking between the fine particles.

In a case where hydroxy groups or silanol groups such as the hexachlorodisiloxane residue remain on the surface of the fine diamond particles after reinforcement formed on the substrate, they may be made hydrophobic by treating with hexamethyl disilazane, monomethoxy silane, monochloro silane, etc.

Since sulfuric add or nitric add is sometimes used in the purifying step for the fine diamond particles used in the invention, sulfonic groups or carboxy groups may be formed on the surface. In this case, at least one metal ions of the group consisting of calcium, strontium, barium, mercury, silver, lead or radium may be bonded to the groups. The method of treating the low dielectric constant film with the metal ions includes, for example, a method of forming a fine diamond particle film having pores, then selecting a water soluble salt such as a hydride, hydrogen chloride or nitrate of the metal and dissolving the metal in water, impregnating the solution into the pores of the fine diamond particle film and bonding the same with the carboxy groups and/or sulfonic groups bonded to the surface of the fine diamond particles, or adding the solution of the metal salt to the dispersion liquid of the fine diamond particles. In this case, for removing unnecessary metal salts, sufficient water washing is applied followed by drying. In a case of conducting the metal salt treatment and the fine particle bonding treatment together, any of them may be conducted previously but conduction of the former previously is easy for treatment.

Further, combination of the metal salt treatment and the hydrophobic agent treatment with hexamethyl disilazane or the like described above provides the effect of both of them, thereby further improving the insulation resistance and dielectric breakdown voltage.

The fine diamond particles used in the invention are preferably solid particles with the particle size of from 1 nm to 1000 nm and purified to a purity of 95% or higher. Further, the porosity of the low dielectric constant film of the invention is preferably from 40% to 80%. In a case where it is 40% or less, the dielectric constant increases to 3 or more mainly in a case where the distribution of the particle size of the fine diamond particles is broad, which is not preferred. Further, in a case where it is 80% or more, no mechanical strength can be obtained, which is insufficient for practical use.

For preparing the colloid of the fine diamond particles, while an aqueous medium is generally used, it is preferred that the fine diamond particles in the dispersion medium are dispersed as primary particles of the particle size described above, but they can also be used when agglomerated to about 30 nm to 1000 nm in appearance to form secondary particles. For dispersion, a known fine particle dispersant or known viscosity modifier may also be used within a range not deteriorating the physical properties such as the dielectric constant, the electric resistance value, and the dielectric breakdown voltage.

Since the fine diamond particle film of the invention has pores, the surface is naturally rough and, accordingly, it is preferably densified. For this purpose, a known method such as an SOG (Spin on Glass) method, an SG (Silicate Glass) film method, a BPSG (Boron Phosphate SG) film method or a plasma CVD method, or a method of coating a dispersion liquid of fine diamond particles of 5 nm or less, etc. can be used.

The temperature for treating the deposited film formed by coating the colloidal solution of the fine diamond particles with the compound containing at least the compound of the above general formula (a) and/or (b) is conducted in a range from a room temperature to 400° C. While depending on the boiling point of the solvent used for diluting the compound, it is preferably treated at a temperature between about 50° C. to 150° C. and reacted simultaneously. Further, the deposited film of the fine diamond particles may be treated at a room temperature with a vapor or liquid containing the compound and then heated and reacted at a temperature between about 40° C. and 400° C., preferably between about 50° C. and 150° C.

The invention also includes an electronic part having the low dielectric constant film described above as a constituent element. As the electronic part, a multilayer winning type semiconductor integrated circuit of high integration degree and high speed operation type is most suitable but it may also be a usual semiconductor device or micro machine, or a usual capacitor having a low dielectric constant film of the invention comprising fine diamond particles and pores (fine porous diamond particle film).

Effect of the Invention

In the fine porous diamond particle film applied with the insolubilizing treatment with metal salt according to the invention, the insulation resistance has been improved by 10 to 20 times and the dielectric breakdown voltage has also been improved by about three times than usual. Further, also the specific dielectric constant as the most prominent feature of the fine porous diamond particle film is unchanged from 2.0 before and after the treatment or lowered to about 1.8 and the function as the low dielectric constant film is sufficiently maintained.

Further, in the fine porous diamond particle film treated with a compound having the general formula —X group which is more hydrophobic than the hydroxyl group of the invention, the insulation resistance has been improved by 100 times or more and the dielectric breakdown voltage has also been improved by 3.5 times or more than those in usual, to reach a practical level. Further, the specific dielectric constant which is a most prominent feature of the fine porous diamond particle film is unchanged as 2.1 before and after the treatment or lowered to about 1.9 and the function as the low dielectric constant film is sufficiently maintained. Further in a case where sulfonic groups or carboxy groups are present on the surface of the fine diamond particles, further lowering of leak current and increase of the dielectric breakdown voltage could be obtained by combination with the treatment with the metal salt such as barium chloride. Further, diamond is known as a material of good heat conductivity, and the heat conductivity is not deteriorated even when pores are formed compared with the existent SOG film.

BEST MODES FOR CARRYING OUT THE INVENTION

Examples of the present invention are to be described below but the invention is not limited only to the examples.

Example 1

Preparation of Colloidal Solution

In pure water in a beaker made of quartz, 5% by weight of purified fine diamond particles and 1% by weight of polyethylene glycol 600 were charged and the beaker was dipped in an ultrasonic wave tank and sufficiently dispersed for one hour to obtain a gray viscous dispersion liquid.

<Spin Coating Step>

A thoroughly cleaned silicon substrate was placed on a spindle of a spin coater, the colloidal solution described above was poured downward and the substrate was rotated at 1500 rpm to uniformly coat the same by a centrifugal force.

<Drying Step>

The silicon substrate coated with a liquid of fine diamond particles was air-dried to form a film and then placed on a hot plate at 300° C. and dried for one hour.

<Reinforcing Treatment for Film Structure>

The silicon substrate with the fine diamond particle film was placed in a vessel and tightly dosed and put to interparticle crosslinking by exposure to a vapor of 1% hexachlorodisiloxane dissolved in dichloromethane at an ambient temperature for one hour and then further applied with on overheating treatment at 300° C. for one hour.

<Metal Salt Treatment>

Then, the substrate with the film was dipped in 1% barium hydroxide solution at an ambient temperature for one hour, after thorough cleaning by downward pouring of pure water, dipped in pure water at an ambient temperature for one hour, and a purified water was further poured downward for sufficient cleaning, followed by drying at 100° C. for one hour.

<Measurement of Current-Voltage Characteristic>

A mercury electrode was placed on the film in an atmospheric air, and a voltage was applied between it and a silicon substrate to measure the voltage, the current value and the dielectric breakdown voltage, which were divided by a previous measured film thickness to calculate the electrolysis intensity.

Figure 1:
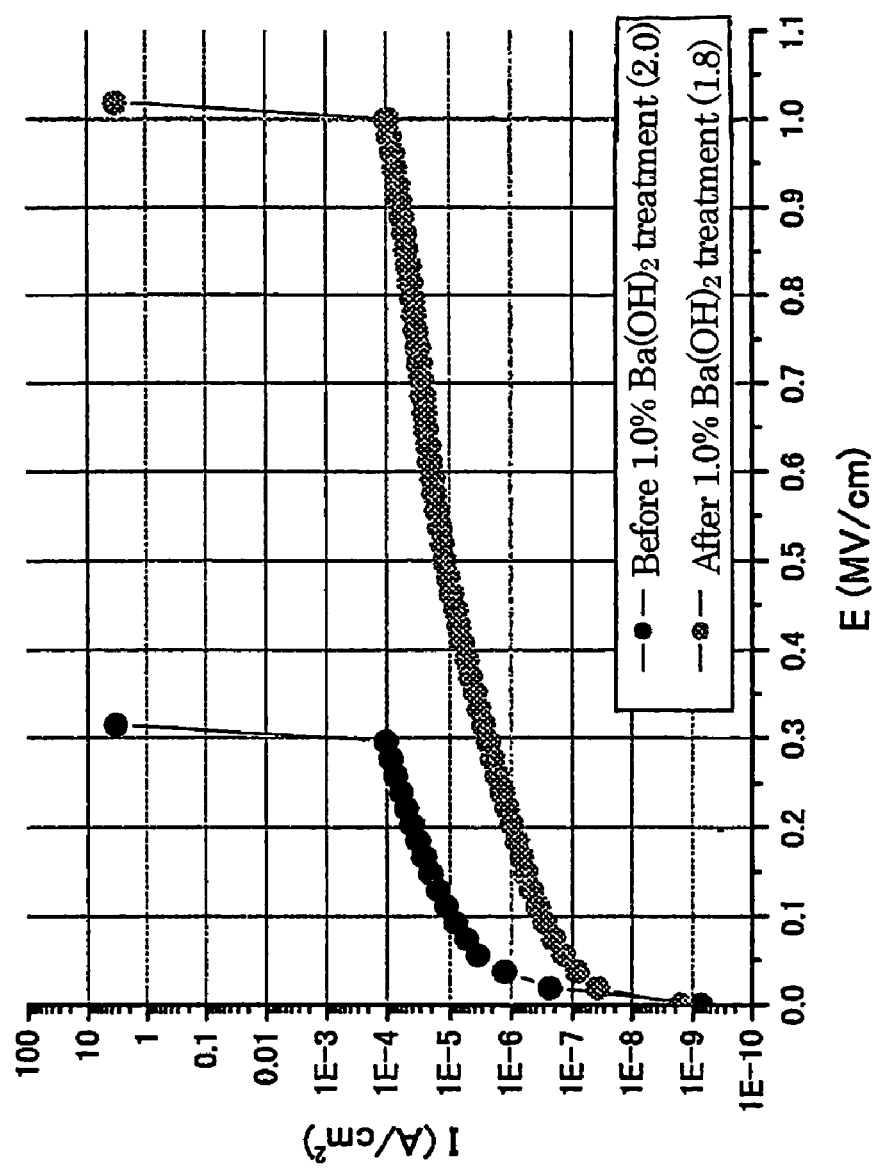
FIG. 1 is a graph showing current-voltage characteristics before and after barium treatment of a fine porous diamond particle film of the invention. Values in the parentheses show specific dielectric constants.

FIG. 1 shows the property of the film at 540 nm thickness obtained in Example 1. In the fine porous diamond particle film treated with barium hydroxide, the dielectric breakdown voltage was improved by three times or more from 0.32 MV/cm to 1.02 MV/cm compared with the film before the treatment. While the leak current representing the insulation resistance was about $1\times10^{-9}$ A/cm$^2$ showing no difference at 0.01 MV/cm, it was decreased by about 20 times from $1\times10^{-4}$ A/cm$^2$ to $2\times10^{-5}$ A/cm$^2$ at 0.3 MV/cm. Further, the specific dielectric constant was improved from 2.0 before the metal salt treatment to 1.8.

Example 2

Experiment was conducted in the same procedures except for conducting the metal salt treatment with 0.17% calcium hydroxide instead of 1% barium hydroxide in Example 1. The film thickness was 430 nm. As a result, it has been found that the dielectric breakdown voltage improved from 0.86 MV/cm to 1.05 MV/cm and the leak current at 0.82 MV/cm decreased from $1\times10^{-4}$ A/cm$^2$ to $7\times10^{-5}$ A/cm$^2$ also by treatment with calcium.

Examples of the invention are to be described below but the invention is not limited only to the examples.

Example 3

Preparation of Colloidal Solution

In pure water in a beaker made of quartz, 5% by weight of purified fine diamond particles and 1% by weight of polyethylene glycol 600 were charged and the beaker was dipped in an ultrasonic wave tank and sufficiently dispersed for one hour to obtain a gray viscous dispersion liquid.

<Spin Coating Step>

A thoroughly cleaned silicon substrate of about 20 mm square applied with a hydrophilic surface treatment was placed on a spindle of a spin coater, the colloidal solution described above was poured downward and the substrate was rotated at 1500 rpm to uniformly coat the same by a centrifugal force.

<Drying Step>

The silicon substrate coated with a liquid of fine diamond particles was air-dried to form a film and then placed on a hot plate at 300° C. and dried for one hour.

<Reinforcing Treatment for Film Structure>

The silicon substrate with the fine diamond particle film was placed in a tightly dosed vessel and put to inter-particle crosslinking by exposure to a vapor of 1% hexachlorodisiloxane (HCDS) dissolved in dichloromethane at an ambient temperature for one hour and then further applied with an overheating treatment at 300° C. for one hour.

<Hydrophobic Treatment>

Then, the substrate with the film was placed in a vessel containing a liquid mixture of 1% hexamethyl disilazane (HMDS)/dichloromethane and tightly closed, and exposed to the vapor at an ambient temperature for one hour to conduct a hydrophobic treatment and, thereafter, further applied with an overheating treatment at 300° C. for one hour.

<Measurement of Current-Voltage Characteristics>

A mercury electrode was placed on a film in an atmospheric air and a voltage was applied between it and a silicon substrate to measure the voltage, the current value and the dielectric breakdown voltage, which were divided with a previously measured film thickness to calculate the electrolysis intensity.

Figure 2:
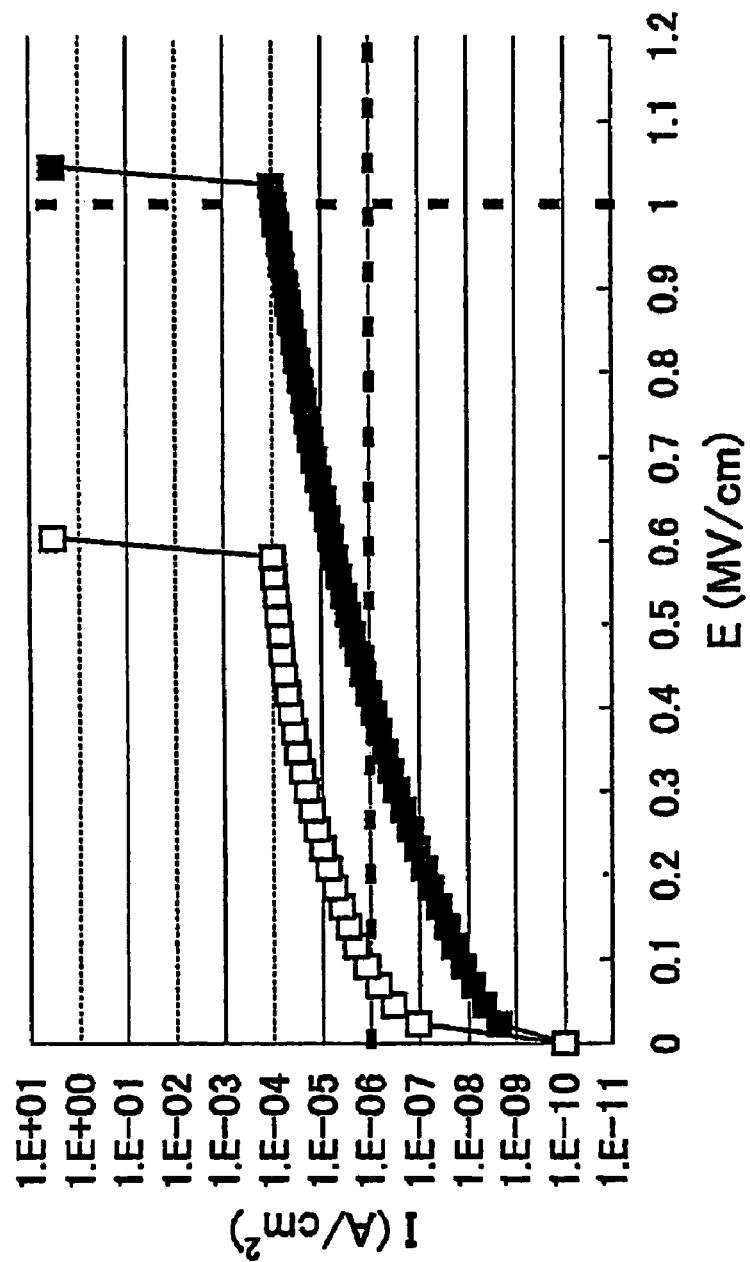
FIG. 2 is a graph showing the current-voltage characteristics of a fine porous diamond particle film according to the invention before and after a hydrophobic treatment.

FIG. 2 shows the current-voltage characteristics of the film at 430 nm thickness obtained in Example 3. In the fine porous diamond particle film applied with a hydrophobic treatment, the dielectric breakdown voltage was improved by about twice from 0.57 MV/cm to 1.03 MV/cm. The leak current representing the insulative resistance was lowered from $1\times10^{-7}$ A/cm$^2$ to $2\times10^{-9}$ A/cm$^2$ at a voltage of 0.01 MV/cm and lowered to $\frac{1}{100}$ from $1\times10^{-15}$ A/cm$^2$ to $1\times10^{-7}$ A/cm$^2$ at 0.23 MV/cm. Further, the specific dielectric constant was unchanged as 2.0 before and after the treatment. As shown by a broken line in FIG. 2, while dielectric breakdown voltage of 1 MV/cm or more is generally required, the invention meets the requirement. Further, while $10^{-6}$ A/cm$^2$ or less of the leak current is required, this could be attained at a voltage of 0.4 MV/cm or lower.

Example 4

Experiment was conducted by the same procedures except for treating with a gas of 1% trimethyl monochloro silane/ toluene solution instead of 1% hexamethyl disilazane in Example 3. The film thickness was 530 nm. As a result, by treatment with trimethyl monochloro silane, 1.11 MV/cm which was higher than 1 MV/cm was attained for the dielectric breakdown voltage and 1.1×10–7 A/cm$^2$ of the leak current was attained at a voltage of 0.2 MV/cm.

Example 5

Preparation of Colloidal Solution

In pure water in a beaker made of quartz, 5% by weight of purified fine diamond particles, 0.1% by weight of dimethylamine, and 1% by weight of polyethylene glycol with a molecular weight of 5,000,000 were charged and the beaker was dipped in an ultrasonic wave tank and sufficiently dispersed for one hour to obtain a gray viscous dispersion liquid.

<Spin Coating Step>

A thoroughly cleaned silicon substrate was cut in about 20 mm square, applied with a hydrophilic surface treatment, and then placed on a spindle of a spin coater, the colloidal solution described above was poured downward and the substrate was rotated at 1500 rpm to uniformly coat the same by a centrifugal force.

<Drying Step>

The silicon substrate coated with a liquid of fine diamond particles was air-dried to form a film and then placed on a hot plate at 300° C. and dried for one hour.

<Reinforcing Treatment for Film Structure>

The silicon substrate with the fine diamond particle film was placed in a tightly dosed vessel, put to interparticle permeating sufficiently by exposure to a vapor of 10% dichlorotetramethyl disiloxane (DCTMDS) dissolved in dichloromethane at an ambient temperature for one hour, and then further applied with an overheating treatment at 300° C. for one hour.

<Measurement of Current-Voltage Characteristics>

A mercury electrode was placed on a film in an atmospheric air and a voltage was applied between it and the silicon substrate to measure the voltage, the current value, and the dielectric breakdown voltage, which were divided with a previously measured film thickness to calculate the electrolysis intensity.

Figure 3:
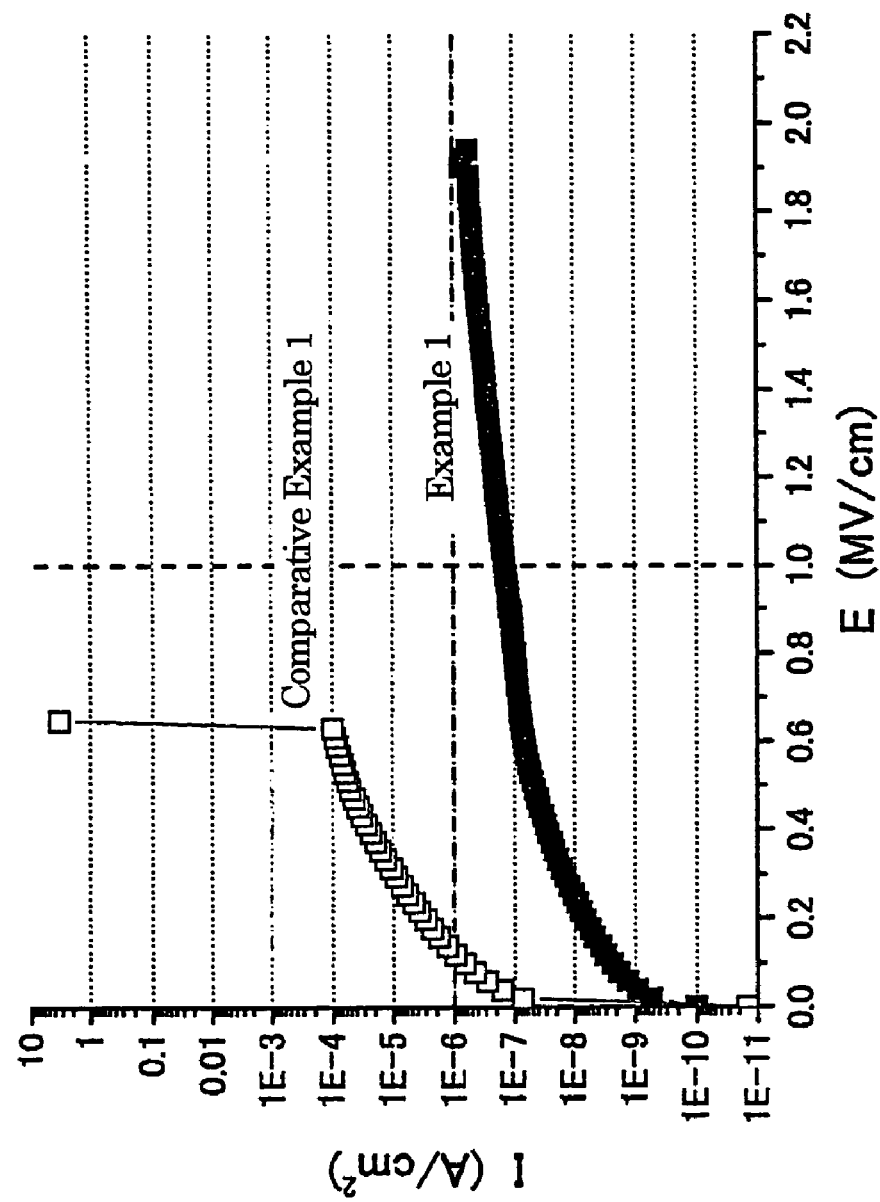
FIG. 3 is a graph showing the current-voltage characteristics of fine porous diamond particle film of Example 1 of the invention (symbol: ■) and a low dielectric film of Comparative Example 1 (symbol: □).
Figure 4:
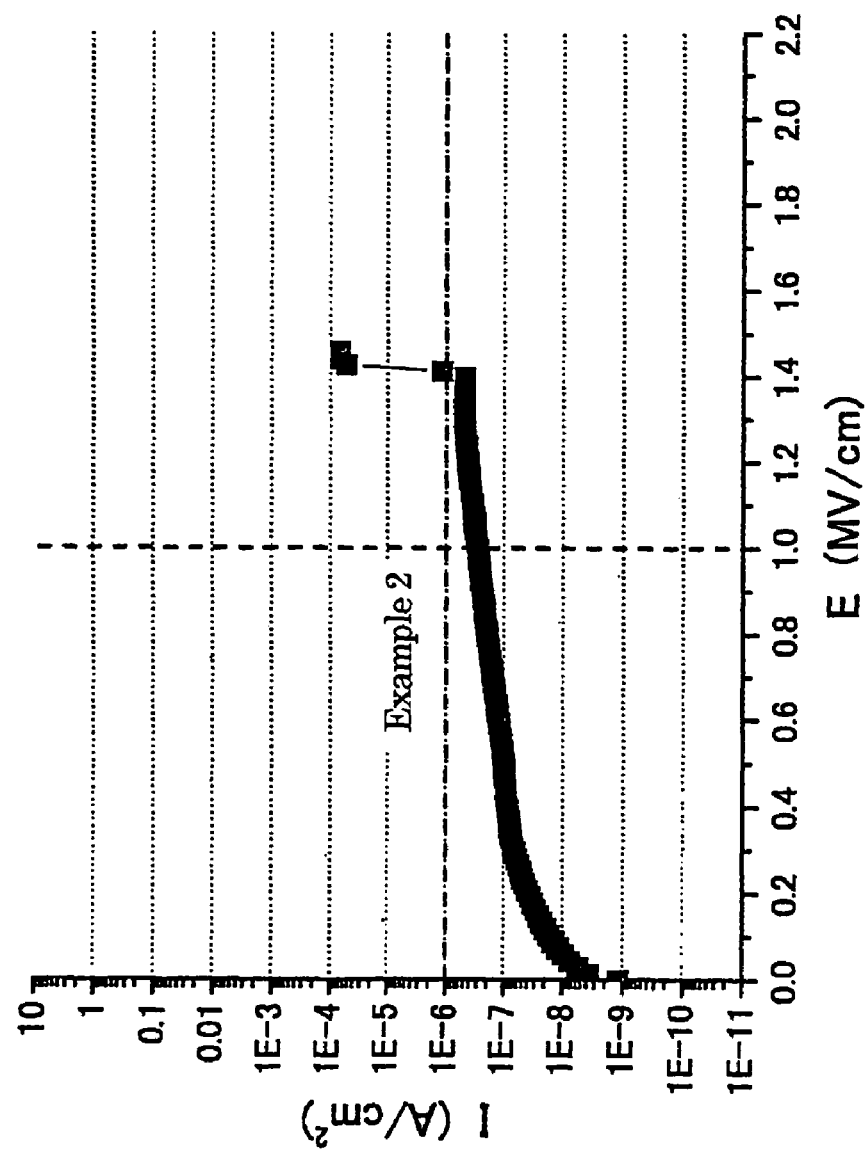
FIG. 4 is a graph showing the current-voltage characteristics of the a dielectric constant film obtained in Example 2 of a fine porous diamond particle film of the invention (symbol: ■).

FIG. 3 shows the current-voltage characteristics of the film at 510 nm thickness obtained in Example 5. In the fine porous diamond particle film applied with a DCTMDS treatment, the dielectric breakdown voltage was improved by 3.5 times or more from 0.57 MV/cm to 2.0 MV/cm (measuring limit) compared with the film obtained in Comparative Example 1 to be described later. The leak current representing the insulation resistance was lowered from $1 \times 10^{-4}$ A/cm$^2$ to $7 \times 10^{-8}$ A/cm$^2$ at a voltage of 0.57 MV/cm and lowered to $1 \times 10^{-7}$ A/cm$^2$ at 1 MV/cm when compared in the same manner. Further, the dielectric constant was unchanged as 2.0 before and after the treatment. As shown by the broken line in FIG. 3, while 1 MV/cm or higher of the dielectric breakdown voltage and $1 \times 10^{-6}$ A/cm$^2$ or less of the leak current are generally required, both of them are cleared in the invention, to reach a practical level.

Further, the fine porous diamond particle film in this example had no disadvantages such as destruction of interparticle bond and maintained sufficient strength upon measurement by contacting the electric characteristic measuring probe or upon finger touch friction.

Example 6

Experiment was conducted in the same procedures except for treatment with a gas of a liquid mixture of 1% by weight of DCTMDS and 1% by weight of hexachloro disiloxane instead of 10% DCTMDS in Example 5. As a result of measurement, the film thickness was 680 nm and the specific dielectric constant was 2.1. A dielectric breakdown voltage of 1.43 MV/cm which was higher than 1 MV/cm and a leak current of $2 \times 10^{-7}$ A/cm$^2$ which was less than $1 \times 10^{-6}$ A/cm$^2$ at a voltage of 1 MV/cm were attained. Further, the fine porous diamond particle film of the example showed no disadvantages such as destruction of interparticle bond and maintained sufficient strength even upon finger touch friction.

Comparative Example 1

Experiment was conducted in the same procedures except for treatment with a gas of 1% by weight of a hexachlorodisiloxane solution instead of 10% by weight of DCTMDS in Example 5. The film thickness was 510 nm. The fine porous diamond particle film had a dielectric breakdown voltage of 0.6 MV/cm and a leak current of $1 \times 10^{-4}$ A/cm$^2$ just before and could not meet the requirement for 1 MV/cm or higher of the dielectric breakdown voltage and $1 \times 10^{-6}$ A/cm$^2$ or less of the leak current as the practical stranded.

INDUSTRIAL APPLICABILITY

According to the invention, a specific dielectric constant of 1.8 has been attained for the first time by using a fine porous diamond particle film which is an inorganic low dielectric constant film having high heat resistance and heat conductivity. Further, also the dielectric breakdown voltage has cleared 1 MV/cm as a practical standard and also the leak current has been about from $10^{-8}$ A/cm$^2$ to $10^{-9}$ A/cm$^2$ at a practical voltage. This enables to manufacture not only multi-layered wiring semiconductor devices or semiconductor capacitors, as well as other high performance general-purpose electronic parts such as high performance capacitors.

According to the invention, a specific dielectric constant of 2.0 has been attained by using a fine porous diamond particle film which is an inorganic low dielectric constant film having high heat resistance and heat conductivity. Further, also the dielectric breakdown voltage has attained 1 MV/cm as a practical standard and also the leak current has been about from $10^{-8}$ A/cm$^2$ to $10^{-9}$ A/cm$^2$ at a practical voltage. This enables to manufacture not only multi-layered wiring semiconductor devices or semiconductor capacitors, as well as other high performance general-purpose electronic parts such as high performance capacitors and inter-wiring insulators.

According to the invention, the specific dielectric constant of 2.0 has been attained by using a fine porous diamond particle film which is an inorganic low dielectric constant film having high heat resistance and heat conductivity. Further, also the dielectric breakdown voltage has attained 2.0 MV/cm (measuring limit) or higher exceeding 1 MV/cm which is the practical standard and also the leak current has attained $1 \times 10^{-7}$ A/cm$^2$ at the practical voltage of 1 MV/cm. This enables to manufacture not only multi-layered wiring semiconductor devices or semiconductor capacitors, as well as other high performance general purpose electronic parts such as high performance capacitors and inter-wiring insulators, and can greatly contribute to the development of electronic industry including computers.

The invention claimed is:

1. A low dielectric constant film comprising a film comprising at least fine diamond particles and pores, wherein the surface of said fine diamond particles is treated with at least one single substance of the following (a) or a mixture of substances of at least one of (a) and at least one of (b) as described below:

(a) a substance represented by the general formula:

$X_nR_{3-n}Si(OSiR_2)_mOSiR_{3-n}X_n$ or dichlorodimethyl silane (b) a substance represented by the general formula;

$X_3Si(OSiR_2)_mOSiX_3$ (where n=1 or 2, m=an integer of 0 to 2, X represents a halogen group, $C_1$ to $C_6$ alkoxy group or phenoxy group, and R represents $C_1$ to $C_6$ alkyl group).

2. The low dielectric constant film of claim 1, wherein X is at least one member selected from the group consisting of chlorine group, methoxy group and ethoxy group and R represents methyl group or ethyl group in the general formula (a) and the general formula (b).

3. The low dielectric constant film of claim 1, wherein is 0 in the general formula (a) and the general formula (b).

4. The low dielectric constant film of claim 1, wherein n is 1 in the general formula (a).

5. The low dielectric constant film of claim 1, wherein said substance of the general formula (a) is at least one member selected from the group consisting of dichloro tetramethyl disiloxane, dimethoxy tetramethyl disiloxane, tetrachloro dimethyl disiloxane and tetramethoxy dimethyl disiloxane, and said substance of the general formula (b) is at least one member selected from the group consisting of hexachlorodisiloxane, hexamethoxy disiloxane and hexaethoxy disiloxane.

6. The low dielectric constant film of claim 1 wherein the surface of said fine diamond particles is treated with at least one member of the general formula (b) in which X represents a $C_1$ to $C_6$ alkoxy group or phenoxy group.

7. An electronic part comprising the low dielectric constant film of claim 1 as at least one constituent element.

8. A method of manufacturing a low dielectric constant film of claim 1, said method comprising the step of chemically reacting hydroxyl groups on the surface of fine diamond particles and at least one single substance of (a) or a mixed substances of at least one of (a) and at least one of (b) described above.

9. The method of manufacturing a low dielectric constant film of claim 8, wherein said substance of the general formula (a) is at least one member selected from the group consisting of dichloro tetramethyl disiloxane, dimethoxy tetramethyl disiloxane, tetrachloro dimethyl disiloxane and tetramethoxy dimethyl disiloxane, and therein said substance of the general formula (b) is at least one member selected from the group consisting of hexachlordisiloxane, hexamethoxy disiloxane and hexaethoxy disiloxane.

* * * * *